(12) United States Patent
Schreck et al.

(10) Patent No.: US 11,205,479 B2
(45) Date of Patent: Dec. 21, 2021

(54) PASSIVE COMPENSATION FOR ELECTRICAL DISTANCE

(71) Applicant: MICRON TECHNOLOGY, INC., Boise, ID (US)

(72) Inventors: John Fredric Schreck, Lucas, TX (US); Hari Giduturi, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/931,080

(22) Filed: May 13, 2020

(65) Prior Publication Data

US 2021/0358545 A1  Nov. 18, 2021

(51) Int. Cl.
*G11C 13/00* (2006.01)
(52) U.S. Cl.
CPC ...... *G11C 13/0026* (2013.01); *G11C 13/0028* (2013.01)
(58) Field of Classification Search
CPC .................. G11C 13/0026; G11C 13/0028
See application file for complete search history.

(56) References Cited

U.S. PATENT DOCUMENTS

| | | | | |
|---|---|---|---|---|
| 4,734,889 A * | 3/1988 | Mashiko | ................ | G11C 29/84 365/200 |
| 5,822,264 A * | 10/1998 | Tomishima | ........... | G11C 11/406 365/222 |
| 6,480,438 B1 * | 11/2002 | Park | ........................ | G11C 16/08 365/100 |
| 2009/0296459 A1 * | 12/2009 | Kim | .................... | G11C 13/0004 365/163 |
| 2010/0321981 A1 * | 12/2010 | Jeon | ........................ | G11C 8/10 365/148 |
| 2018/0040371 A1 * | 2/2018 | Kim | .................... | G11C 13/0023 |
| 2019/0214057 A1 * | 7/2019 | Won | ........................ | G11C 7/065 |
| 2019/0348096 A1 * | 11/2019 | Antonyan | ........... | G11C 11/1673 |

* cited by examiner

*Primary Examiner* — Khamdan N. Alrobaie
(74) *Attorney, Agent, or Firm* — Fletcher Yoder, P.C.

(57) ABSTRACT

An architecture of the memory device may leverage a transmission path resistance compensation scheme for memory cells to reduce the effect of parasitic loads in accessing a memory cell. A memory cell of such a memory device may experience a total resistance including a transmission path resistance associated with the respective access lines of the memory cell and an added compensatory resistance. The foregoing memory device may leverage a spike mitigation scheme to mitigate the harmful effect of a voltage and/or rush current to the near memory cells of the memory device. In addition, spike mitigation circuitry may include coupling a resistor on access lines near the respective decoders. Further, spike mitigation circuitry may include coupling a resistor between the decoders.

20 Claims, 6 Drawing Sheets

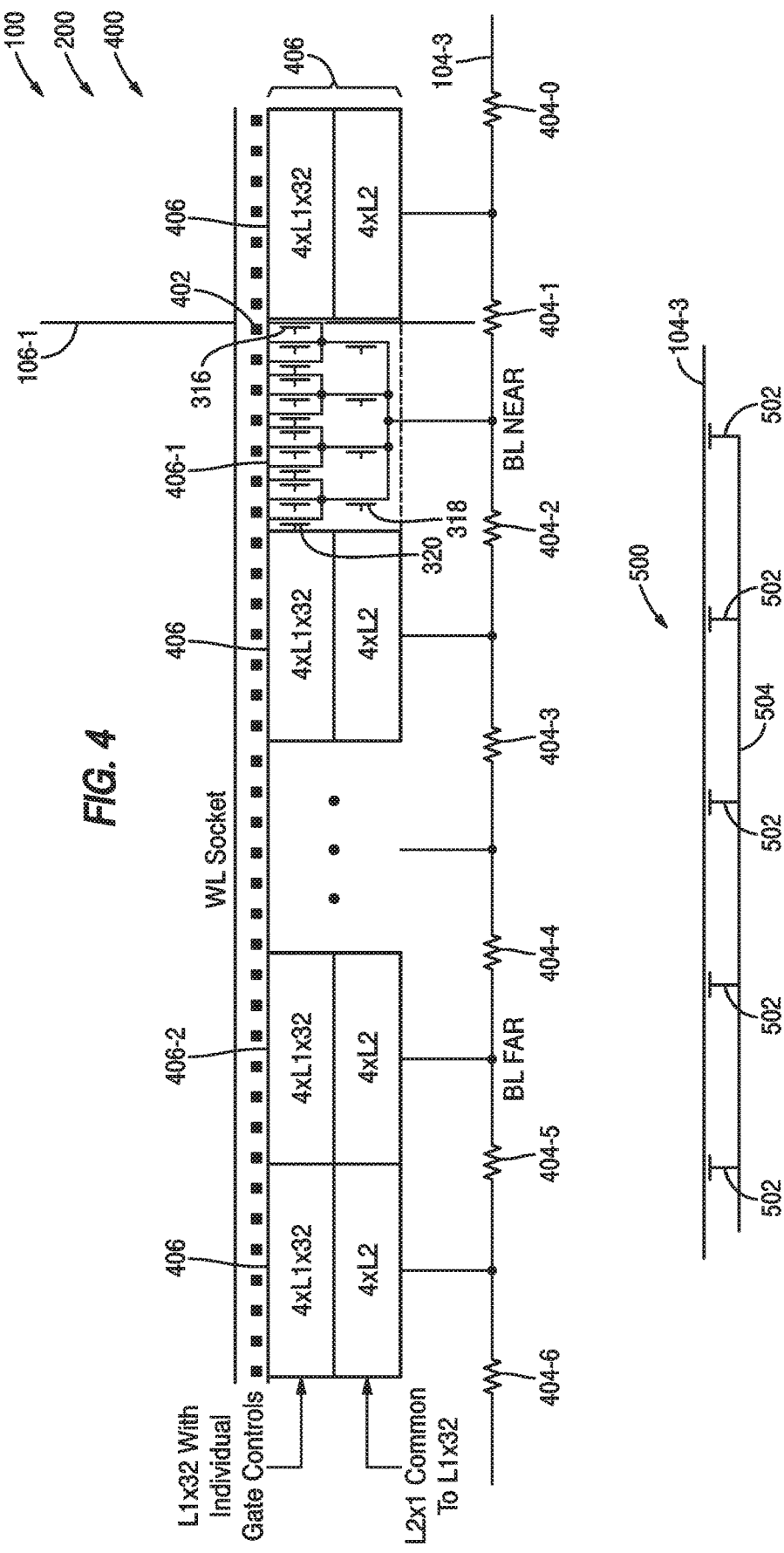

PASSIVE COMPENSATION FOR ELECTRICAL DISTANCE

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

Some of the memory devices include memory cells that may be accessed by turning on a transistor that couples the memory cell (e.g., a capacitor) with a wordline or a bitline. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell.

With threshold-type memories, wordlines and bitlines are used to transmit selection signals to respective memory cells. The selection signals may include signals characterized by voltage levels used to save data into or retrieve data from the memory cells. The wordlines and bitlines may couple to selection signal sources through decoding circuitry (e.g., decoders). In a standard "quilt" architecture, decoders may couple to one side of the wordlines or one side of the bitlines.

The standard architecture of the memory cells in a memory device may cause different memory cells to have different physical distances on wordlines and bitlines from the decoders. The wordlines and bitlines may each introduce a parasitic resistance on a memory cell, dependent on a position of the memory cell on the wordline driver or the bitline driver. Memory cells disposed relatively farther from the decoders on a respective wordline or bitline may suffer from a higher parasitic resistance introduced by the wordline or the bitline. However, memory cells disposed closer to the decoders of the respective wordline or bitline may experience lower parasitic resistance. Moreover, the memory cells may experience a net resistance as a result of the parasitic resistance introduced by the wordline and the bitline. That is, different memory cells may experience different net parasitic resistances due to different distances of memory cells from the decoders on their respective wordline and bitline. Subsequently, memory cells disposed relatively farther from the decoders, on a wordline or a bitline, may suffer from low current delivery amplitudes, on the wordline or the bitline, during programming due to the high resistance path to the decoders. An approach for uniform current delivery from the decoders to the memory cells may be desired.

BRIEF DESCRIPTION OF THE DRAWINGS

Various aspects of this disclosure may be better understood upon reading the following detailed description and upon reference to the drawings in which:

FIG. 4 is a diagram of the portion of the memory of FIG. 1 including a resistance compensation scheme, in accordance with an embodiment;

FIG. 5 is a portion of the memory array of FIG. 2 including an alternative resistance compensation scheme, in accordance with an embodiment;

DETAILED DESCRIPTION

Figure 1:
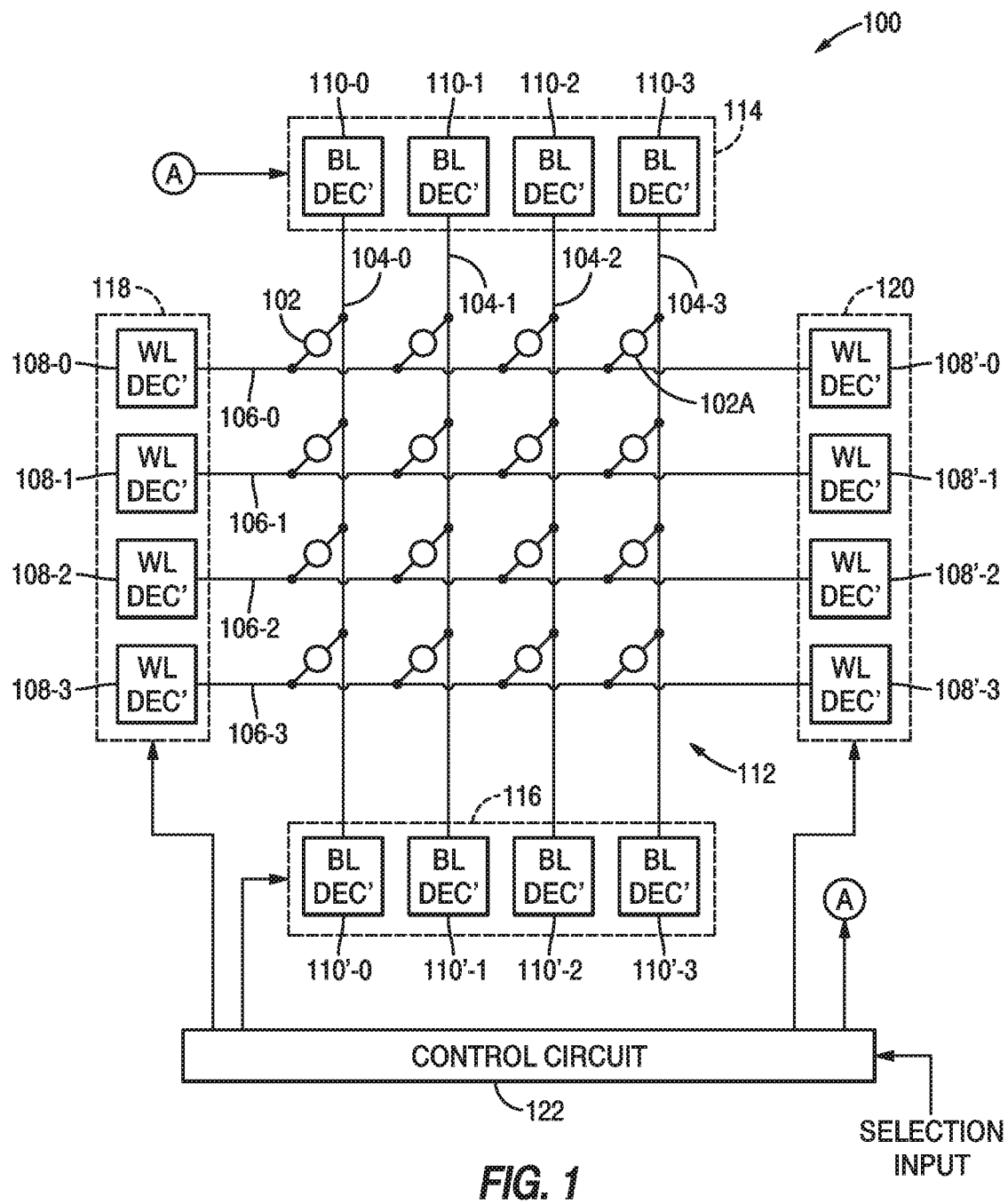
FIG. 1 is a block diagram of a portion of a memory, in accordance with an embodiment.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells with each memory cell coupled to at least two access lines. For example, a memory cell may be coupled to a bitline and a wordline. As such, each access line may be coupled to a large number of memory cells. To select a memory cell, a decoder circuit associated with a first access line for the memory cell and a decoder circuit associated with a second access line for the memory cell may both provide a voltage and/or a current on the respective access lines. By applying voltages and/or currents to the respective access lines, the memory cell may be accessed, such as to write data to the memory cell and/or read data from the memory cell.

Since each access line may be coupled to a larger number of memory cells, each memory cell may be at a different physical distance from respective decoder circuits of the access lines. Further, since distances between memory cells and a selection signal source may be different, a parasitic load associated with each memory cell may vary based on the distances. The parasitic load may include a resistance of the metal traces used to form the access lines, and parasitic capacitances associated with both the metal traces and the associated decoder circuits. As such, each memory cell may have a different associated transmission path resistance or parasitic resistance due to different physical distances from the respective decoder circuits of the access lines which may not be negligible. Transmission path resistances associated with each memory cell may affect the voltages and/or currents (e.g., selection signals) each memory cell receives when the respective decoder circuits provide the voltages and/or currents to the respective access lines of each memory cell. That is, while a voltage provided by a decoder circuit to an access line may be the same for each memory cell associated with the access line, a received voltage and a voltage delay associated with the received voltage by a particular memory cell may differ from other memory cells along the same access line. This is the received voltage at a memory cell may vary, at least in part, due to the location of a memory cell along the access line with respect to the decoder circuit, such as a physical distance between the decoder circuit and the memory cell.

Keeping the foregoing in mind, when providing selection signals to memory cells, greater voltages and/or currents may be used to compensate for any transmission path resistances affecting memory cells disposed at an end of an access line. However, this may lead to a current spike and/or voltage spike (e.g., voltage or current that is greater than a threshold amount of voltage or current) being delivered to memory cells disposed closer to the decoder. Thus, it may be desired to improve a design of a memory cell array to improve delivery of selection signals (e.g., a likelihood and/or occurrence of current spikes and/or voltage spikes is reduced).

In accordance with embodiments described herein, an architecture of the memory device may leverage a transmission path resistance compensation scheme for memory cells to reduce the effect of parasitic loads in accessing a memory cell. A memory cell of such a memory device may experience a total resistance including a transmission path resistance associated with the respective access lines of the memory cell and an added compensatory resistance. The memory device may compensate for transmission path resistances of a respective bitline and a respective wordline of a memory cell using the transmission path resistance compensation scheme as described in detail below.

At the time of accessing each memory cell, a compensatory resistance may be imposed on either of the access lines of a memory cell that may be proportional to a transmission path resistance of an opposing access line of the memory cell. In some embodiments, the memory device may include a predetermined total resistance associated with accessing the memory cells and may include the transmission path resistances of the respective access lines of a target memory cell and the imposed compensatory resistance. In these embodiments, the compensatory resistance imposed on an access line may be inversely proportional to the transmission path resistance of the opposing access line to impose the predetermined total resistance. Having the foregoing in mind, the compensatory resistance may be externally and/or passively applied to the access lines.

The compensatory resistance value may depend on the physical distance of the memory cell being accessed from the respective decoding circuitry. In some examples, the compensatory resistance may cause the total resistance of each memory cell of a memory device to approximately equal a transmission path resistance of a full length of a bitline and a wordline of the respective memory device. That is, the compensatory resistance may proportionally increase the total resistance of memory cells to cause the total resistance of each memory cell to approximately equal the transmission path resistance between the decoders and the farthest memory cell of the memory device.

The transmission path resistance compensation scheme may allow the decoders of a memory device to provide the same voltage and/or current to access different memory cells. Moreover, each memory cell may receive equal voltage and/or current regardless of their physical distance to the respective decoders due to the equal total resistance of each memory cell. The transmission path resistance compensation scheme may require the decoders to provide a voltage and/or current proportional to the voltage and/or current required to access the farthest memory cell for accessing different memory cells of such memory device.

In some embodiments, the voltage provided by the decoders for accessing a memory cell on the respective bitline and/or wordline may initially include a higher voltage and/or current (e.g., a voltage spike, a rush current, or both). In these embodiments, the memory cells near the decoders may experience a voltage spike, current rush, or both that may be undesirable or even detrimental to the near memory cells.

An embodiment of the foregoing memory device may leverage a spike mitigation scheme to mitigate the harmful effect of a voltage and/or rush current to the near memory cells of the memory device. In one embodiment, spike mitigation circuitry may include coupling a resistor on access lines near the respective decoders. In other embodiments, a spike mitigation circuitry may include coupling a resistor between the decoders. Moreover, different embodiments may include selective coupling of one or more resistors on access lines near decoders and/or between decoders. Specific embodiments of this architecture are described below.

Keeping the foregoing introduction in mind, FIG. 1 is a block diagram of a portion of a memory 100. The memory 100 may be any suitable form of memory, such as non-volatile memory (e.g., a cross-point memory) and/or volatile memory. The memory 100 may include one or more memory cells 102, one or more bitlines 104 (e.g., 104-0, 104-1, 104-2, 104-3), one or more wordlines 106 (e.g., 106-0, 106-1, 106-2, 106-3), one or more wordline decoders 108 (e.g., wordline decoding circuitry), and one or more bitline decoders 110 (e.g., bitline decoding circuitry). The memory cells 102, bitlines 104, wordlines 106, wordline decoders 108, and bitline decoders 110 may form a memory array 112.

Each of the memory cells 102 may include a selector and/or a storage element. When a voltage across a selector of a respective memory cell reaches a threshold, the storage element may be accessed to read a data value from and/or write a data value to the storage element. In some embodiments, each of the memory cells 102 may not include a separate selector and storage element, and have a configuration such that the memory cell nonetheless acts as having a selector and storage element (e.g., may include use of a material that behaves both like a selector material and a storage element material). When memory cells 102 have a single material that functions as a selector and storage element, these architectures may leverage single material (e.g., chalcogenide) process architectures and may have respective values set within each memory cell by leveraging positive signals (e.g., positive voltages, positive currents) to set a logic high value in the memory cell and by leveraging negative signals or lower voltage signals (e.g., negative voltages, negative currents) to clear a logic high value or set a logic low value in the memory cell. Single material process architectures may use bipolar decoders (e.g., driving circuitry) to access the memory cell during operation of a memory 100. In some cases, unipolar decoders may be used, such as when a neutral mid-point between a positive signal level and a negative signal level is shifted to equal half a voltage difference between the bitlines 104 and wordlines 106.

For ease of discussion, FIG. 1 may be discussed in terms of bitlines 104, wordlines 106, wordline decoders 108, and bitline decoders 110, but these designations are non-limiting. The scope of the present disclosure should be understood to cover memory cells 102 that are coupled to multiple access lines and accessed through respective decoders, where an access line may be used to store data into a memory cell and read data from the memory cell.

The bitline decoders 110 may be organized in multiple groups of decoders. For example, the memory 100 may include a first group of bitline decoders 114 (e.g., multiple bitline decoders 110) and/or a second group of bitline decoders 116 (e.g., different group of multiple bitline decoders 110). Similarly, the wordline decoders 108 may also be arranged into groups of wordline decoders 108, such as a first group of wordline decoders 118 and/or a second group of wordline decoders 120. In different embodiments, the group of bitline decoders 114 and 116 and/or the group of wordline decoders 118 and 120 may be referred to as decoder segments. Decoders may be used in combination with each other to drive the memory cells 102 (e.g., such as in pairs and/or pairs of pairs on either side of the wordlines 106 and/or bitlines 104). For example, bitline decoder 110-3 may operate in conjunction with bitline decoder 110'-3 and/or with wordline decoders 108-0 and 108'-0 to select a target memory cell 102-A. As may be appreciated herein, decoder circuitry on either end of the wordlines 106 and/or bitlines 104 may be different.

In some embodiments, to reduce or eliminate the occurrence of a voltage spike and/or current rush when selecting and/or accessing a target memory cell, thereby improving operation of the memory 100, a spike mitigation scheme may be used between the bitlines 104, wordlines 106 and the respective wordline decoders 108 and bitline decoders 110 when operating the memory 100. For example, when targeting the memory cell 102-A, the memory 100 may activate one or more resistors located close to the wordline decoders 108-0 and 108'-0, and bitline decoders 110-3 and 110'-3 to mitigate the effect of a possible voltage spike of the respective decoders. The selection and location of resistors may be discussed in further detail with respect to FIGS. 6-8. This may allow delivering an intended voltage or current to a memory cell while mitigating the harmful effects of possible voltage/current spikes on memory cells near the decoders.

Each of the bitlines 104 and/or wordlines 106 may be metal traces disposed in the memory array 112, and formed from metal, such as copper, aluminum, silver, tungsten, or the like. Accordingly, the bitlines 104 and the wordlines 106 may have a uniform or near uniform resistance per length and a uniform parasitic capacitance per length, such that a resulting parasitic load may uniformly increase per length. As such, a transmission path resistance of each of the memory cells 102 may be different with respect to each of the wordline decoders 108 and/or bitline decoders 110 due at least in part to differences in physical distance between the memory cells 102 and each of the associated decoding circuitry. It should be noted that the depicted components of the memory 100 may include additional circuitry not particularly depicted and/or may be disposed in any suitable arrangement. For example, a subset of the wordline decoders 108 and/or bitline decoders 110 may be disposed in the middle or at the two ends of the bitlines 104 and/or wordiness 106 of the memory array 112 and/or on a different physical side of any plane including the circuitries.

These parasitic effects may affect driving of the decoding circuitry when accessing memory cells 102 since accessing (e.g., thresholding) a target memory cell of the memory cells 102 may include supplying voltages and/or currents to a targeted memory cell, such as the target memory cell 102-A. Inconsistent parasitic resistances between memory cells 102 may make driving selection of memory cells 102 difficult since signals received by a relatively near memory cell may be larger than signals received by a relatively far memory cell. Thus, conventional methods may use relatively larger signals when accessing far memory cells relative to the decoders. As such, the wordline decoders 108 and/or bitline decoders 110 may access far memory cells by providing higher voltage and/or current to adjust a voltage across the targeted memory cell (e.g., target memory cell 102-A) to achieve a threshold voltage.

For example, a ground reference voltage may be provided on the bitline 104-3 while a positive voltage is provided on a wordline 106-0, such that a voltage difference between ground and the positive voltage is greater than the threshold voltage. However, when distances between memory cells 102 cause resistance of transmission paths (e.g., a particular length of a bitline and/or of a wordline) taken by the signals to be inconsistent between memory cells 102, some of the resulting transmitted voltage and/or currents provided to each of the memory cells 102 may vary based on resistances of the transmission path used to transmit the signals. Therefore, the memory 100 may include a transmission path resistance compensation scheme to allow a uniform provision and reception of voltage between the decoding circuitry (e.g., a subset of the wordline decoders 108 and/or bitline decoders 110) and the different memory cells 102 of the memory 100, as described below with respect FIGS. 3 and 4.

The memory 100 may also include a control circuit 122. The control circuit 122 may communicatively couple to respective wordline decoders 108 and/or bitline decoders 110 to perform memory operations, such as by causing the decoding circuitry to generate or provide selection signals (e.g., selection voltage and/or selection currents) for selecting a target of the memory cells. In some embodiments, a positive voltage and a negative voltage may be provided on one or more of the bitlines 104 and/or wordlines 106, to a target memory cell of the memory cells 102. In some embodiments, the decoder circuits may provide electrical pulses (e.g., voltage and/or current) to the access lines to access the target memory cell. The electrical pulse may be a square pulse, or in other embodiments, other shaped pulses may be used. In some embodiments, a voltage provided to the access lines may be a constant voltage.

Activating the decoder circuits may enable the delivery of an electrical pulse to a target memory cell 102-A such that the control circuit 122 is able to access data storage of the target memory cell, such as to read from or write to the data storage. The control circuit 122 receives control signals (e.g., selection inputs) that may determine which of the respective pairs of bitline decoders 110 and/or of the wordline decoders 108 to activate first. The control signals may be based on which of the bitline decoders 110 and the wordline decoders 108 are physically farther and/or closer to the target memory cell 102-A. The relative physical distance from the decoder circuits to the target memory cell may be based on a memory address of the target memory cell. An order in which the decoder circuits are activated may be determined by various other logic (not shown) of the memory 100, such as control logic that receives address information.

After a target memory cell 102-A is accessed, data stored within storage medium of the target memory cell may be read or written. Writing to the target memory cell may include changing the data value stored by the target memory cell. As previously discussed, the data value stored by a memory cell may be based on a threshold voltage of the memory cell. In some embodiments, a memory cell may be "set" to have a first threshold voltage, or may be "reset" to have a second threshold voltage. A set memory cell may have a lower threshold voltage than a reset memory cell. By setting or resetting a memory cell, different data values may be stored by the memory cell. Reading the target memory cell 102-A may include determining whether the target memory cell was characterized by the first threshold voltage and/or by the second threshold voltage. In this way, a threshold voltage window may be analyzed to determine a value stored by the target memory cell 102-A. The threshold voltage window may be created by applying programming pulses with opposite polarity to the memory cells 102 (e.g., in particular, writing to select/storage material (SD) of the memory cell) and reading the memory cells 102 (e.g., in particular, reading a threshold voltage of the memory cell) using a signal with a given (e.g., known) fixed polarity.

In some cases, to access the target memory cell 102-A, a respective of the bitline decoders 110 and of the wordline decoders 108 farther from the target memory cell 102-A may be activated by the control circuit 122. For example, the bitline decoder and the wordline decoder furthest from the target memory cell 102-A (e.g., bitline decoder 110'-0 and wordline decoder 108-3) may provide a voltage through a transmission path characterized by a larger parasitic load (e.g., having a higher resistance) due to the greater physical distance between the target memory cell 102-A and the bitline decoder 110'-3 or the wordline decoder 108-3. A transmission path characterized by a larger parasitic load and/or resistance may reduce the effect of current spikes generated when accessing the target memory cell 102-A. Additionally or alternatively, after the target memory cell 102-A is selected, the control circuit 122 may operate to activate the bitline decoder and the wordline decoder closest to the target memory cell 102-A to cause a delivery of a current to the target memory cell 102-A. The current may be a maximum current able to be provided by the decoders and/or associated with a given (e.g., known) fixed polarity used to read or write to the SD material of the target memory cell 102-A. Delivery of the current from the second decoder may occur after a snap-back of the memory cell 102-A.

Figure 2:
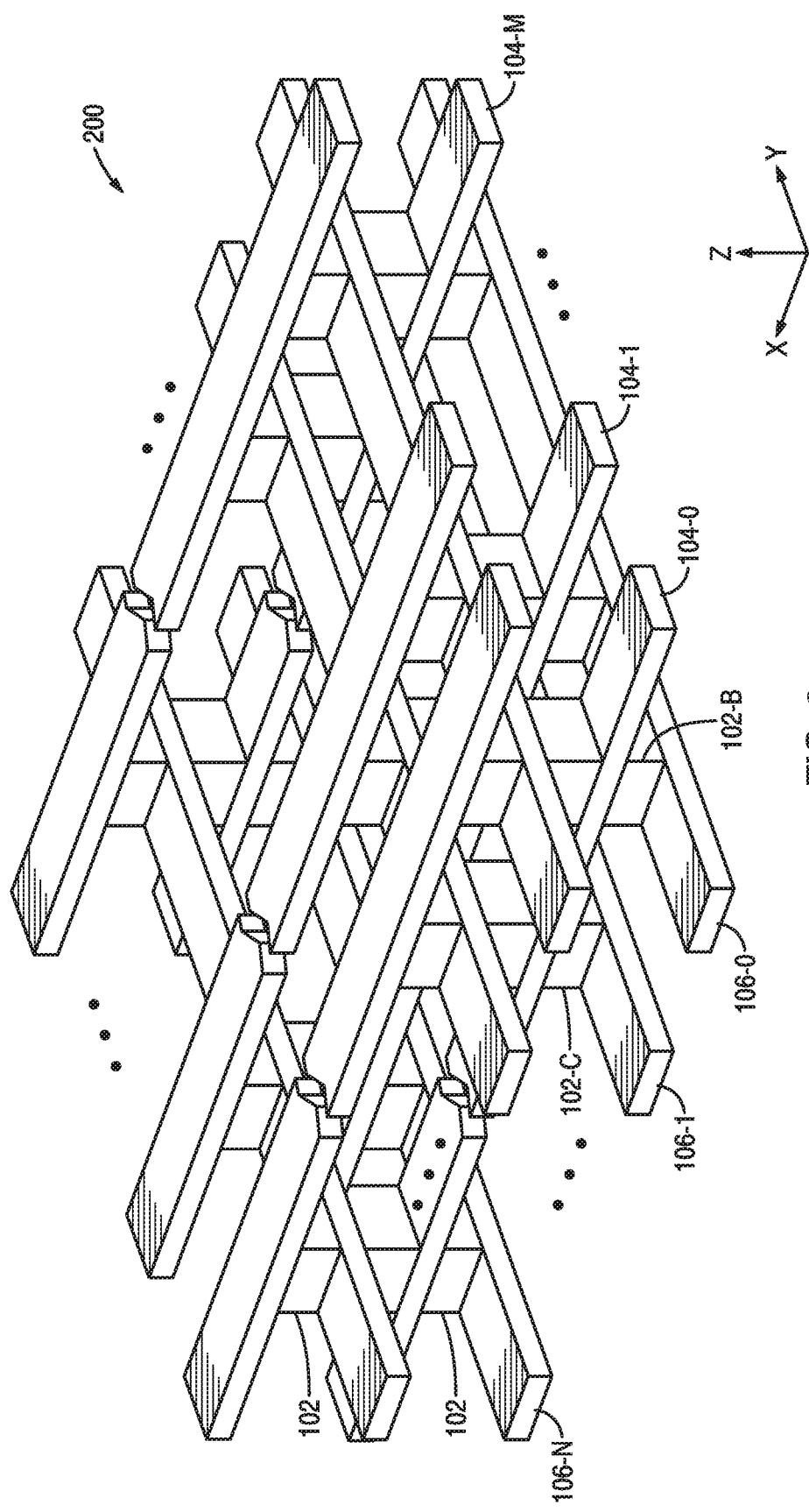
FIG. 2 is a diagram of the portion of the memory of FIG. 1, in accordance with an embodiment.

FIG. 2 is a diagram illustrating a portion of a memory array 200 in accordance with an embodiment of the present disclosure. The memory array 200 may be a cross-point array including wordlines 106 (e.g., 106-0, 106-1, . . . , 106-N) and bitlines 104 (e.g., 104-0, 104-1, . . . , 104-M). A memory cell 102 may be located at each of the intersections of the wordlines 106 and bitlines 104. The memory cells 102 may function in a two-terminal architecture (e.g., with a particular of the wordlines 106 and the bitlines 104 serving as the electrodes for a particular of the memory cells 102). It should be noted that the memory array 200 of FIG. 2 is by the way of example and relates to a specific embodiment of the memory 100. Different memory array arrangements may be used in different embodiments of this disclosure.

Each of the memory cells 102 may be resistance variable memory cells, such as resistive random-access memory (RRAM) cells, conductive-bridging random access memory (CBRAM) cells, phase-change memory (PCM) cells, and/or spin-transfer torque magnetic random-access memory (STT-RAM) cells, among other types of memory cells. Each of the memory cells 102 may include a memory element (e.g., memory material) and a selector element (e.g., a select/storage material (SD)) and/or a material layer that functionally replaces a separate memory element layer and selector element layer. The selector element (e.g., SD material) may be disposed between a wordline contact and a bitline contact associated with a wordline or bitline forming the memory cells 102. Electrical signals may transmit between the wordline contact and the bitline contact when reading or writing operations are performed to the memory cells 102.

The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cells 102 may include a memory portion (e.g., the portion programmable to different states). For instance, in resistance variable memory cells, a memory element can include the portion of the memory cell having a resistance that is programmable to particular levels corresponding to particular states responsive to applied programming voltage and/or current pulses. In some embodiments, the memory cells 102 may be characterized as threshold-type memory cells that are selected (e.g., activated) based on a voltage and/or current crossing a threshold associated with the selector element and/or the memory element. Embodiments are not limited to a particular resistance variable material or materials associated with the memory elements of the memory cells 102. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 102 may be programmed by applying a voltage (e.g., a write voltage) across the memory cells 102 via selected wordlines 106 and bitlines 104. A sensing (e.g., read) operation may be performed to determine a state of one or more memory cells 102 by sensing current. For example, the current may be sensed on one or more bitlines 104 corresponding to the respective memory cells 102 in response to a particular voltage applied to the selected of the wordlines 106 forming the respective memory cells 102.

As illustrated, the memory array 200 may be arranged in a cross-point memory array architecture (e.g., a three-dimensional (3D) cross-point memory array architecture) that extends in any direction (e.g., x-axis, y-axis, z-axis). The multi-deck cross-point memory array 200 may include a number of successive memory cells (e.g., 102B, 102C)

disposed between alternating (e.g., interleaved) decks of bitlines 104 and wordlines 106. The number of decks may be expanded in number or may be reduced in number and should not be limited to the depicted volume or arrangement. Each of the memory cells 102 may be formed between the wordlines 106 and the bitlines 104 (e.g., between two access lines), such that a respective one of the memory cells 102 may be directly electrically coupled (e.g., electrically coupled in series) with its respective pair of the bitlines 104 and wordlines 106 and/or formed from electrodes (e.g., contacts) made by a respective portion of metal of a respective pair of bitlines 104 and wordlines 106. For example, the memory array 200 may include a three-dimensional matrix of individually-addressable (e.g., randomly accessible) memory cells 102 that may be accessed for data operations (e.g., sense and write) at a granularity as small as a single storage element and/or multiple storage elements. In some cases, the memory array 200 may include more or less bitlines 104, wordlines 106, and/or memory cells 102 than shown in the examples of FIG. 2.

It should be noted that memory array 200 is with respect to certain embodiments of this disclosure. The embodiments described below may be incorporated into the memory 100 using the memory array 200, or any other viable memory array.

Figure 3:
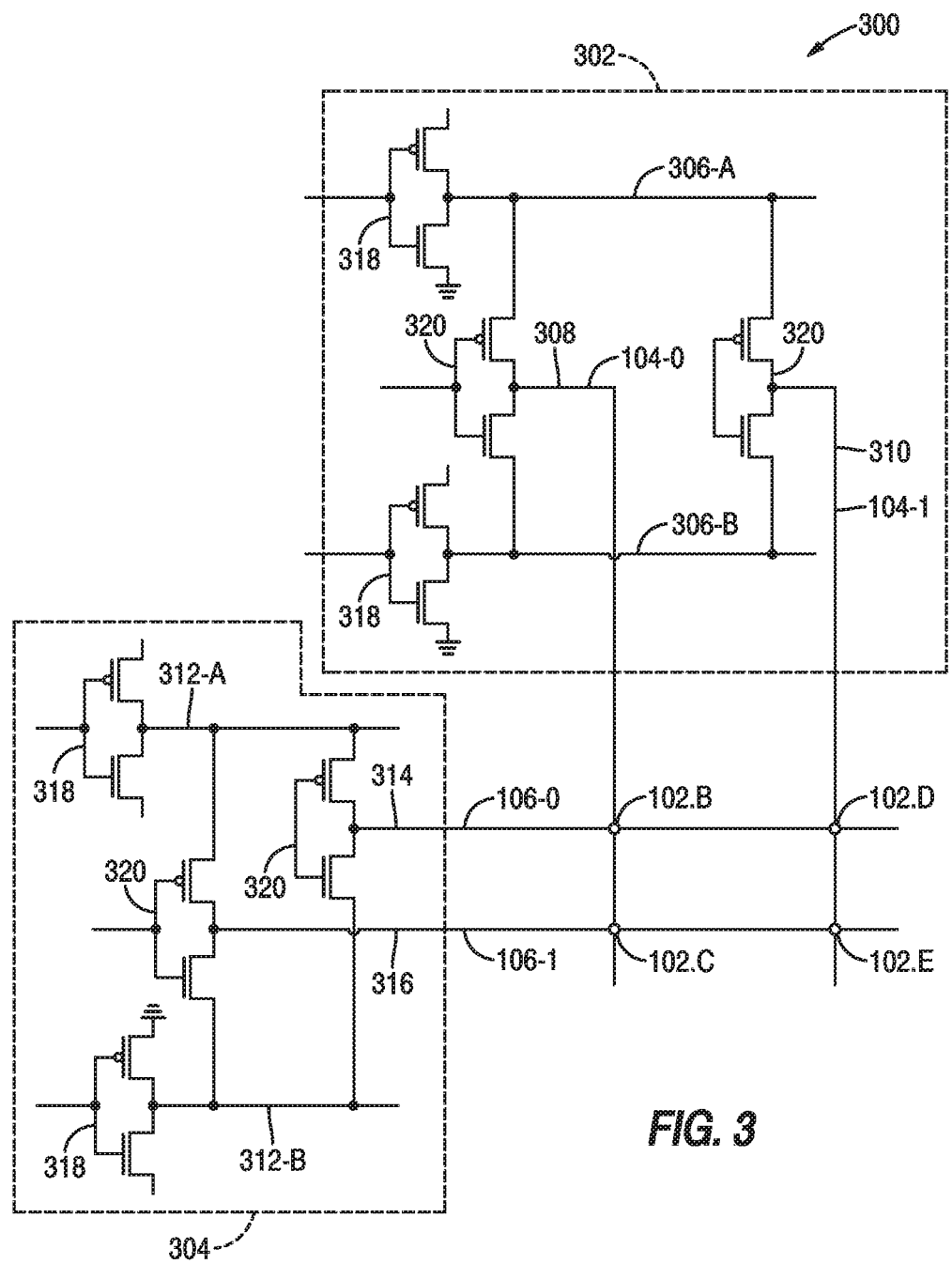
FIG. 3 is a portion of decoding circuitry that may be used with respect to specific embodiments of the memory of FIG. 1 and the memory array of FIG. 2.

FIG. 3 depicts a portion of decoding circuit 300 that may be used in specific embodiments of the memory 100 of FIG. 1 including the memory array 112 of FIG. 2. The decoding circuit 300 may be referred to as a bipolar decoder. The decoding circuit 300 may include bitline decoder circuit 302 and wordline decoder circuit 304. The bitline decoder circuit 302 may be an embodiment of the bitline decoders 110 of FIG. 1 and the wordline decoder circuit 304 may be an embodiment of the wordline decoders 108 of FIG. 1. The bitline decoder circuit 302 and the wordline decoder circuit 304 of the decoding circuit 300 may drive the bitlines 104-0 and 104-1, the wordlines 106-0 and 106-1, and the memory cells 102-B, 102-C, 102-D, and 102-E of the memory array 200, as described in detail below.

The decoding circuit 300 may include a positive global bitline 306-A and a negative global bitline 306-B that may drive a first local bitline 308 and a second local bitline 310. The decoding circuit 300 may also include a positive global wordline 312-A and a negative global wordline 312-B that may drive a first local wordline 314 and a second local wordline 316 in the illustrated portion of the memory array 200. Level-two decoder circuit 318 or outer decoder may control the global bitlines, such as the global bitlines 306-A and 306-B or the global wordlines 312-A and 312-B. Moreover, level-one decoder circuit 320 or inner decoder may control a local bitline, such as the first local bitline 308 or the second local bitline 310, or a local wordline, such as the first local wordline 314 or the second local wordline 316. The level-two decoder circuit 318 and level-one decoder circuit 320 may be implemented using switching circuitry, such as transistors, in different embodiments.

In some embodiments, the global bitlines 306-A and 306-B may drive the first local bitline 308 and the second local bitline 310 differentially, whereas other voltage configuration arrangements may be provided to the respective local bitlines in other embodiments. Furthermore, other embodiments may use different circuit arrangements to drive the respective memory cells 102 of the memory 100.

In the illustrated embodiment of the FIG. 3, the first local bitline 308 may drive the bitline 104-0 and the second local bitline 310 my drive the bitline 104-1 of FIG. 2. Moreover, the first local wordline 314 may drive the wordline 106-0 and the second local wordline 316 may drive the wordline 106-1 of FIG. 2. That said, the first local bitline 308 and the first local wordline 314 may provide for accessing the memory cell 102-B, the first local bitline 308 and the second local wordline 316 may provide for accessing the memory cell 102-C, the second local bitline 310 and the first local wordline 314 may provide for accessing a memory cell 102-D, and the second local bitline 310 and the second local wordline 316 may provide for accessing a memory cell 102-E when instructed by the control circuit 122.

It should be noted that a portion of the global bitlines 306 and the global wordlines 312 is shown in the depicted portion of the decoding circuit 300. For example, in some embodiments, each global bitline of the global bitlines 306 may drive 32 local bitlines, including the first local bitline 308 and the second local bitline 310. The global wordlines 312 may drive 32 local wordlines, including the first local wordline 314 and the second local wordline 316. It should also be noted that the depicted portion of the decoding circuit 300 is one embodiment of the wordline decoders 108 and/or bitline decoders 110 and other embodiments may be used in different embodiments of the described memory 100.

FIG. 4 is a side-view of a diagram illustrating a portion of the memory 100 of FIG. 1 including the memory array 200 of FIG. 2 and a resistance compensation scheme 400, with respect to some embodiments of this disclosure. When accessing a memory cell of the memory cells 102, the resistance compensation scheme 400 may include additional circuitry to add resistance and compensate for transmission path resistance of the respective bitline and/or wordline of the target memory cell 102-A. The resistance compensation scheme 400 may cause the same total resistance associated with accessing the target memory cell 102-A.

When accessing the target memory cell 102-A (not shown in FIG. 4), the resistance compensation scheme 400 may facilitate compensating for the transmission path resistance of the bitline 104-3 by the compensatory resistance on the respective wordline 106-1. Simultaneously, the resistance compensation scheme 400 may facilitate compensating for the transmission path resistance of the wordline 106-1 by the compensatory resistance on the bitline 104-3 associated with the target memory cell 102-A. In this way, the resistance compensation scheme 400 may cause the total resistance on memory cells 102 of the memory device 100 to equal a transmission path resistance associated with a full length of a bitline of the bitlines 104, such as the bitline 104-3, and a transmission path resistance of a full length of a wordline of the wordlines 106, such as the wordline 106-1 of the memory device 100. As such, the total resistance associated with memory cells 102 of the resistance compensation scheme 400 may be predetermined and may be independent of the position of a memory cell in the memory 100.

The depicted portion of memory 100 in FIG. 4 may include wordline sockets. Each wordline socket may include/couple decoders coupled to a wordline to access a memory cell. For example, a wordline socket 402 may couple to the wordline 106-1. The memory 100 may include additional sockets coupled to other wordlines 106 and/or bitlines 104 not shown in the FIG. 4. Moreover, sockets associated with bitlines 104 may be positioned perpendicular to the wordline sockets. Other circuitry of the sockets 402 may be used when transmitting signals to access the memory cells 102.

The illustrated portion of the resistance compensation scheme 400 in FIG. 4 may include compensatory resistors 404 disposed onto the bitline 104-3 between different decoder segments 406. In different embodiments, the decoder segments 406 may include one or multiple decoding circuitries, such as the decoding circuit 300 of FIG. 3. In other embodiments, different arrangement or architecture of decoding circuitry and/or wordlines may be used to drive the memory cells 102. Moreover, the compensatory resistors 404 may be implemented in any viable form, such as polymer-based resistive material or any resistive metal layer. Furthermore, the resistance compensation scheme 400 may be implemented passively. This may prevent imposing undesired parasitic load on the memory 100.

In the depicted embodiment, each decoder segment of the decoder segments 406 of FIG. 4 may include 4 level-two decoder circuits 318 to drive 4 global wordlines. Moreover, each global wordline may drive 32 level-one decoder circuits 320, each coupled to a local wordline. That is, each decoder segment of the decoder segments 406 may include 128 local wordlines to access memory cells 102 positioned on the respective 128 local wordlines. In some embodiments, differential level-two decoder circuits and differential global wordlines may be used to drive the level-one decoder circuits and the local wordlines.

In some embodiments, when accessing a target memory cell, the compensatory resistors 404 on a respective bitline of the bitlines 104, associated with the target memory cell, may compensate for a transmission path resistance associated with a respective wordline of the wordlines 106, associated with the target memory cell. As such, the compensatory resistors 404 on a wordline may compensate for a transmission path resistance of a respective bitline.

With the foregoing in mind, the resistance compensation scheme 400 may include compensatory resistors 404 coupled to bitlines 104 and wordlines 106 of the memory 100. For example, in FIG. 4 the resistance compensation scheme 400 may include compensatory resistors 404 coupled to the bitline 104-3 to compensate for transmission path resistance of the wordline 106-1 when accessing a target memory cell using the bitline 104-3 and the wordline 106-1. In this embodiment, the resistance of the bitline 104-3 when accessing the memory cell may be calculated using the formula below. Rbl may be the transmission path resistance of the bitline segment between the bitline decoder and the memory cell. Rext may be the resistance added by the compensatory resistors 404 on the bitline 104-3 to compensate for the transmission path resistance of the wordline 106-1. Rblmax may equal the resistance of a full-length bitline.

$$Rext+Rbl=Rblmax$$

Rext resistance value may depend on the arrangement of the decoder segments 406 in different embodiments and the location of a wordline 106 in a memory array. The Rext may equal the compensatory resistors 404 of a respective bitline 104 or wordline 106 in series to a wordline 106/bitline 104. For example, the wordline 106-1 may couple to the socket 402 of a decoder segment 406-1, which may couple to a BL NEAR node of the bitline 104-3. In one example, the wordline 106-1 and bitline 104-3 may be used to access a respective memory cell. In this example, the Rext on the bitline 104-3 may equal the series equivalent of compensatory resistor 404-1 with the compensatory resistors 404-2, 404-3, 404-4, 404-5, and 404-6.

In another example, if a wordline 106 is coupled to a wordline socket of the decoder segment 406-2, the Rext on the bitline 104-3 may be determined from the BL FAR node. That is, the Rext may equal the compensatory resistors 404-5 and 404-6 in series. It should be noted that the compensatory resistors shown on the FIG. 4 are with respect to a specific embodiment of the disclosure and any suitable arrangement of the compensatory resistor 404 may be used on the bitlines and wordlines of the memory 100 in different embodiments.

The compensation scheme 400 may also include compensatory resistors 404 coupled to the bitline 104-3 to compensate for transmission path resistance of the wordline 106-1 not shown in the illustration portion of the FIG. 4. Moreover, the Rext on the wordline 106-1 may be determined in the same manner.

The resistance compensation scheme 400 may use the compensatory resistors 404 to impose compensatory resistances on the wordlines 106 and bitlines 104. In some embodiments, a bitline transmission path resistance value may be inversely proportional to the respective compensatory resistance value imposed on a respective wordline of a memory cell. Moreover, a wordline transmission path resistance value may be inversely proportional to the respective compensatory resistance value imposed on a respective bitline when accessing a memory cell. That is, the total resistance of each memory cell may include the transmission path resistance of the respective bitline, the respective wordline compensatory resistance imposed by the compensatory resistors 404, the transmission path resistance of the respective wordline, and the bitline compensatory resistance imposed by the compensatory resistors 404.

In specific embodiments, the resistance compensation scheme 400 may cause each of the memory cells 102 to include the same total resistance value. Accordingly, the memory 100 may use the same voltage and/or current to access different memory cells 102 because of equal total resistance value of memory cells 102. As such, each memory cell of the memory cells 102 may receive equal voltage and/or current regardless of their physical distance to the respective decoders. In such embodiments, the decoding circuitry may provide a voltage and/or current proportional to the voltage and/or current required to access the farthest memory cell of the memory cells 102 from the decoding circuitry to access the rest of the memory cells 102.

FIG. 5 is a side-view of an alternative embodiment 500 of compensatory resistors 404, on the bitline 104-3 of FIG. 4. The embodiment of FIG. 5 may use transistors 502 in place of compensatory resistors 404. The transistors 502 may be positioned on a bitline compensation bias line 504. The bitline compensation bias line 504 may provide a gate bias voltage to each of the transistors 502. The transistors 502 may impose DC resistance on the bitline 104-3 based at least in part on the provided gate bias voltage.

The transistors 502 may be positioned in series along the rest of the bitlines 104 and on their respective bitline compensation bias lines, such as the compensation bitline 504, in the memory 100. This may allow compensation for transmission path resistances of the wordlines 106 on the respective bitlines 104 using transistors 502, when accessing a memory cell. Additionally, transistors 502 may be positioned in series along the wordlines 106 and on a respective wordline compensation bias lines (not shown in FIG. 5) in the memory 100. As such, the alternative embodiment 500 of resistance compensation scheme 400 may compensate for the transmission path resistances of a respective bitline 104 and a respective wordline 106, in the same manner as the resistance compensation scheme 400 of FIG. 4, using transistors 502 disposed on compensation bias lines.

Figure 6:
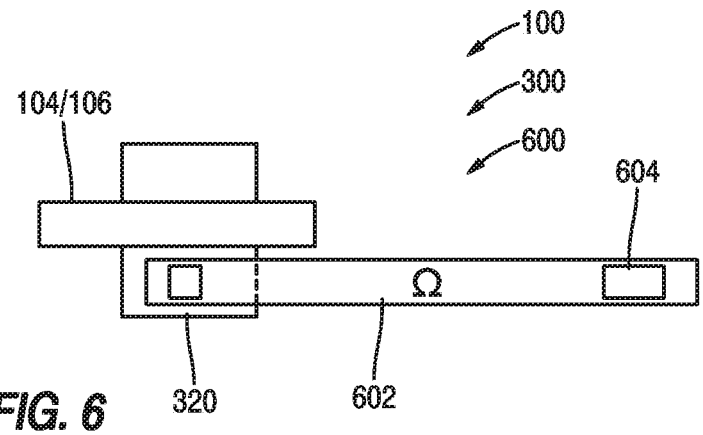
FIG. 6 is a block diagram of a portion of the memory of FIG. 1 including added resistance for spike mitigation, in accordance with an embodiment.

FIG. 6 depicts a portion of the memory 100 of FIG. 1 including spike mitigation circuitry 600 and a portion of the decoding circuit 300. The illustrated portion of the memory 100 includes level-one decoder circuit 320, a hook up metal 602, and a via 604. The hook up metal 602 may hook up from the level one-decoder circuit 320 to the via 604 to provide access to memory cells 102 positioned on a relative access line of the level one-decoder circuit 320. The via 604 may couple to different bitlines 104 or wordline 106 to facilitate accessing the memory cells 102 having different electrical distances from the decoder circuitry.

The spike mitigation circuitry 600 may reduce the effect of rush currents and/or voltage spikes on the memory cells of the memory 100. The hook up metal 602 may include higher electrical resistance near the level-one decoder circuit 320 of the decoding circuit 300. In different embodiments, the hook up metal 602 may include high resistance material, external resistor coupled, or both. In certain embodiments, the external resistor may be programmable to allow resistance adjustments for different electrical distances. The additional resistance may be applied passively to the hook up metal 602. Specific embodiments related to hook up metal 602 resistance may be described below with respect to FIGS. 7 and 8.

The via 604 may also include high resistance material. As such, the via 604 may reduce the effect of a spike voltage close to the decoder circuitry of the near memory cells. Accordingly, the via 604 may reduce a damaging effect of a possible voltage spike to the near memory cells 102 (not shown in FIG. 6). The additional resistance may be applied passively to the via 604.

In specific embodiments, the spike mitigation circuitry 600 and the resistance compensation scheme 400 may be incorporated on the memory 100. As described above, the resistance compensation scheme 400 may cause provision of a voltage and/or current proportional to the voltage and/or current required to access the farthest memory cell 102. In these embodiments, a voltage spike is more likely to occur. The spike mitigation circuitry 600 may alleviate a damaging effect of voltages higher than a threshold on near memory cells 102 by the resistance compensation scheme 400. It should be noted that the specific value of the hook up metal 602 and the via 604 may be adjusted in different embodiments in accordance with different factors, such as a size of the memory 100.

Moreover, the illustrated level one-decoder circuit 320, hookup metal 602, and the via 604 may be uniformly replicated on other level-one decoder circuit 320 of the memory 100. This may allow uniform spike mitigation across all the decoders of a decoder circuit 300 and/or memory 100.

Figure 7:
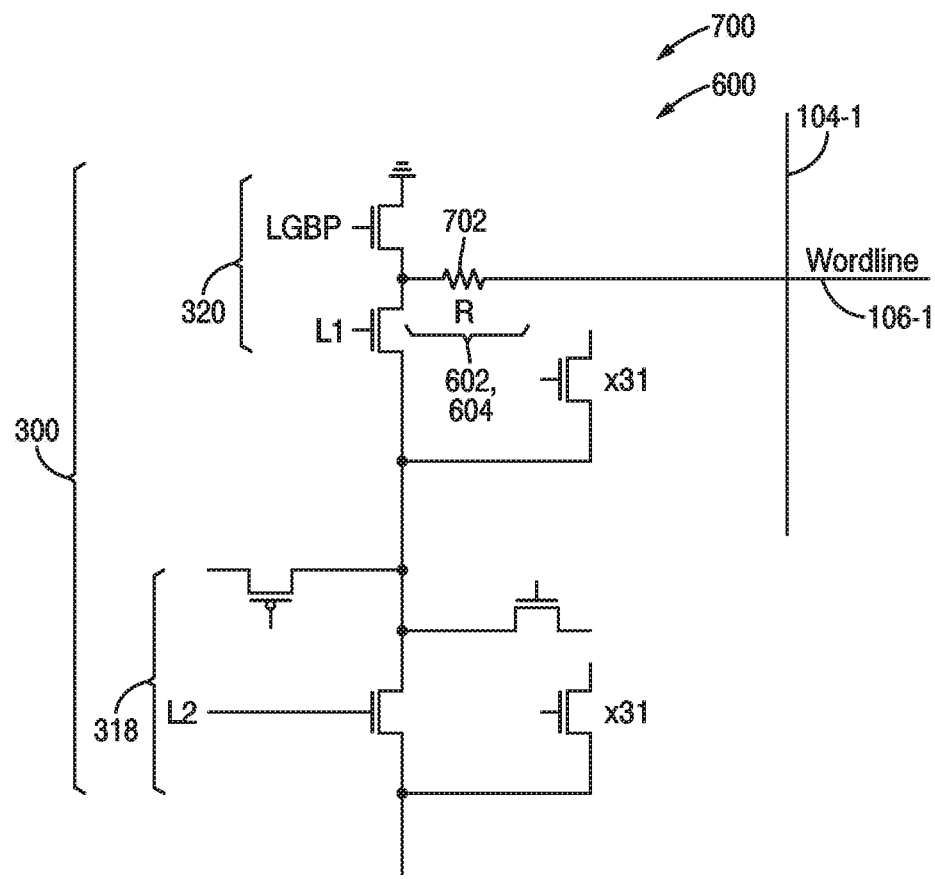
FIG. 7 is a schematic depicting a first embodiment associated with the block diagram of FIG. 6.

FIG. 7 depicts a schematic 700 that may be used with respect to a first embodiment related to the spike mitigation circuitry 600 of FIG. 6. The schematic 700 may include a bitline 104, a wordline 106, and the decoding circuit 300 including the level-two decoder circuit 318 and the level-one decoder circuit 320 coupled to the wordline 106-1. It should be noted that the schematic 700 shows single decoding circuit 300 connected to the wordline 106-1, however, the schematic may be used to drive the wordlines 106 of the memory 100 by the way of one or multiple decoding circuit 300.

A resistor 702 may be disposed between the wordline 106-1 and the level-one decoder circuit 320 in the first embodiment of the spike mitigation circuitry 600. When accessing a memory cell via the wordline 106-1 and the bitline 104-1, the resistor 702 may impose an electrical resistance on a voltage spike to mitigate the damaging effect of the voltage spike on the near memory cells. In different embodiments, the hook up metal 602 or the via 604 may include the resistor 702 between the wordline 106-1 and the level-one decoder circuit 320.

Figure 8:
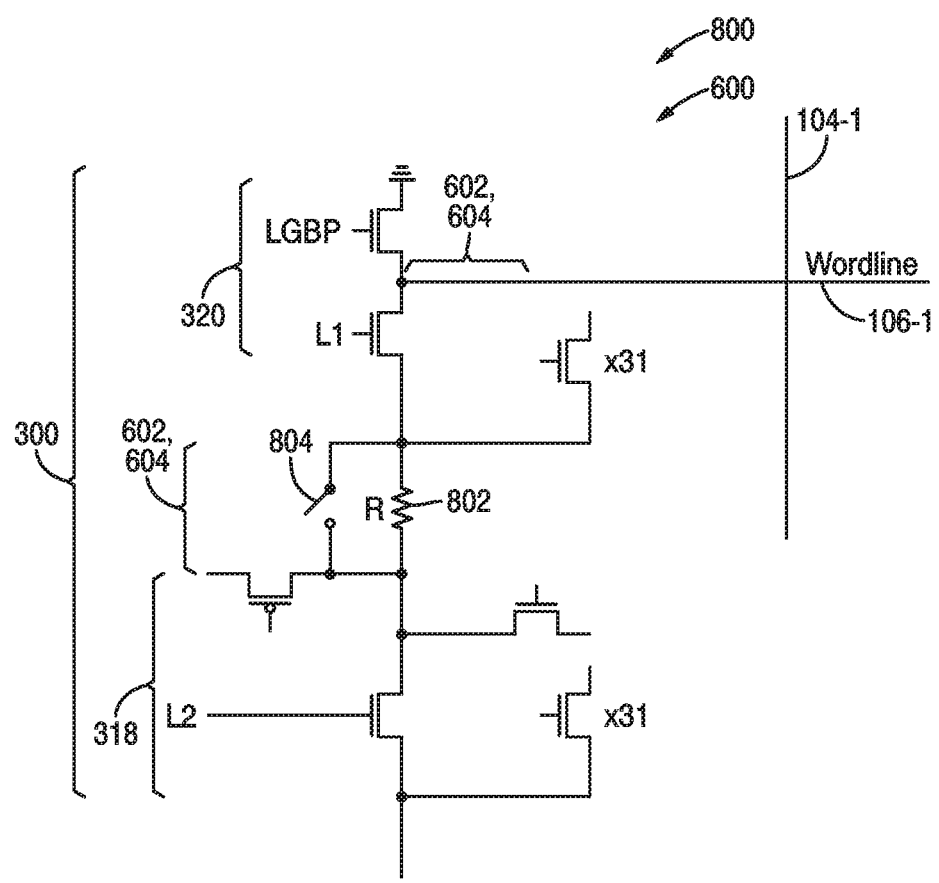
FIG. 8 is a schematic depicting a second embodiment associated with the block diagram of FIG. 6.

FIG. 8 depicts a schematic 800 that may be used with respect to certain embodiments related to the spike mitigation circuitry 600 of FIG. 6. The schematic 800 may include a bitline 104, a wordline 106, and the decoding circuit 300 including the level-two decoder circuit 318 and the level-one decoder circuit 320 coupled to the wordline 106. The decoding circuit 300 may include a resistor 802 disposed between the level-one decoder circuit 320 and the level-two decoder circuit 318. Moreover, the decoding circuit 300 may include a switch 804 that may enable or disable the effect of the resistor 802. The switch 804 may be programmable to bypass the resistor 802 or include the resistor 802 in the decoding circuit 300 when accessing a memory cell on the wordline 106-1.

For example, the switch 804 may be shorted to bypass the resistor 802 when a voltage associated with the decoding circuit 300 is lower than a threshold. Alternatively, the switch 804 may be opened to effectively dispose the resistor 802 in the decoding circuit 300 between the level-two decoder circuit 318 and the level-one decoder circuit 320 when a voltage associated with the decoding circuit 300 is higher than a threshold. It should be noted that using one resistor 802 in the depicted embodiment of FIG. 8 is by the way of example and different number of resistors and switches may be used in different embodiments to effectively reduce the effect of spike voltages. It should be noted that the schematic 800 shows a single decoding circuit 300 connected to the wordline 106-1, however, the schematic may be used to drive the wordlines 104 of the memory 100 by the way of one or multiple decoding circuit 300.

With these technical effects in mind, multiple memory devices may be included on a memory module, thereby enabling the memory devices to be communicatively coupled to the processing circuitry as a unit. For example, a dual in-line memory module (DIMM) may include a printed circuit board (PCB) and multiple memory devices. Memory modules respond to commands from a memory controller communicatively coupled to a client device or a host device via a communication network. Or in some cases, a memory controller may be used on the host-side of a memory-host interface; for example, a processor, microcontroller, field programmable gate array (FPGA), application-specific integrated circuit (ASIC), or the like may each include a memory controller. This communication network may enable data communication there between and, thus, the client device to utilize hardware resources accessible through the memory controller. Based at least in part on user input to the client device, processing circuitry of the memory controller may perform one or more operations to facilitate the retrieval or transmission of data between the client device and the memory devices. Data communicated between the client device and the memory devices may be used for a variety of purposes including, but not limited to, presentation of a visualization to a user through a graphical user interface (GUI) at the client device, processing operations, calculations, or the like. Thus, with this in mind, the above-described improvements to memory controller operations and memory writing operations may manifest as improvements in visualization quality (e.g., speed of rendering, quality of rendering), improvements in processing operations, improvements in calculations, or the like.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus, comprising:
a memory array comprising a plurality of memory cells disposed between at least two access lines of a plurality of access lines of the memory array, wherein:
a first access line of the plurality of access lines comprises a first electrical current path configured to provide access to a target memory cell of the plurality of memory cells on a first side of the target memory cell, wherein the first electrical current path comprises a first parasitic electrical resistance associated with accessing the target memory cell; and
a second access line of the plurality of access lines comprises a second electrical current path configured to provide access to the target memory cell on a second side of the target memory cell, wherein the second access line comprises a first one or more resistors disposed on the second access line between at least two memory cells of the plurality of memory cells and configured to provide a first compensatory resistance when providing access to the target memory cell, and wherein the second electrical current path comprises a second parasitic electrical resistance associated with accessing the target memory cell.

2. The apparatus of claim 1, wherein a resistance value of the first compensatory resistance of the second access line is proportional to a resistance value of the first parasitic electrical resistance of the first access line.

3. The apparatus of claim 1, wherein each of the at least two memory cells are coupled to the second access line on a first side and coupled to a respective access line of the plurality of access lines on a second side.

4. The apparatus of claim 3, wherein each of the respective access lines coupled to the second side of the at least two memory cells are associated with different decoder segments of the memory array, wherein each decoder segment comprises a plurality of decoder elements configured to drive a number of access lines of the plurality of access lines.

5. The apparatus of claim 1, wherein the first one or more resistors are disposed in series on the second access line.

6. The apparatus of claim 1, wherein a total resistance value of the second parasitic electrical resistance and the first compensatory resistance is proportional to a resistance value of a parasitic electrical resistance value associated with a full length of the first electrical current path of the first access line.

7. The apparatus of claim 1, wherein the first access line comprises a second one or more resistors disposed on the second access line configured to provide a second compensatory resistance when providing access to the target memory cell.

8. The apparatus of claim 7, wherein a resistance value of the second compensatory resistance of the first access line is proportional to a resistance value of second parasitic electrical resistance of the second access line.

9. The apparatus of claim 8, wherein a total resistance value of the first parasitic electrical resistance and the second compensatory resistance is proportional to a resistance value of a parasitic electrical resistance value associated with a full length of the second electrical current path.

10. The apparatus of claim 1, wherein the memory array comprises a cross-point memory array comprising a plurality of successive memory cells disposed between interleaved decks of the plurality of access lines.

11. The apparatus of claim 1, wherein the memory array comprises a first decoder, wherein a first side of the first decoder is coupled to the first access line, wherein the first decoder is configured to provide an access signal for accessing the target memory cell.

12. The apparatus of claim 11, wherein the memory array comprises a second decoder, wherein the second decoder is coupled to a second side of the first decoder, wherein the second decoder is configured to drive the first decoder.

13. A method for imposing uniform resistance when accessing memory cells of a memory array, comprising:
compensating, by a first one or more resistors arranged between at least two memory cells coupled to a first access line associated with accessing a first side of a memory cell of the at least two memory cells, a first parasitic resistance of a second access line associated with accessing a second side of the memory cell; and
compensating, by a second one or more resistors arranged between at least two memory cells coupled to the second access line, a second parasitic resistance of the first access line.

14. The method of claim 13, wherein a total resistance of the first parasitic resistance and the first one or more resistors equals a parasitic resistance of the second access line associated with accessing the farthest memory cell on the second access line.

15. The method of claim 13, wherein a total resistance of the second parasitic resistance and the second one or more resistors equals a parasitic resistance of the first access line associated with accessing the farthest memory cell on the first access line.

16. A semiconductor device, comprising:
a memory array comprising:
a plurality of memory cells;
one or more resistors arranged between at least two memory cells of the plurality of memory cells; and
a plurality of access lines, wherein a first access line of the plurality of access lines is configured to provide a first voltage to access a first side of a first memory cell of the at least two memory cells of the plurality of memory cells, wherein the first voltage is independent of the location of the first memory cell in the memory array based on the first access line having a first resistance associated with accessing the first memory cell that is independent of a location of the first memory cell in the memory array caused at least in part by the one or more resistors arranged between the at least two memory cells of the plurality of memory cells.

17. The semiconductor device of claim 16, wherein a second access line of the plurality of access lines is configured to provide the first voltage to access a first side of a second memory cell of the plurality of memory cells, based on the second access line having the first resistance associated with accessing the second memory cell caused at least in part by the one or more resistors arranged between the at least two memory cells of the plurality of memory cells.

18. The semiconductor device of claim 16, wherein the first access line is coupled to a first side of a first level decoder via a first decoder resistor.

19. The semiconductor device of claim 18, wherein a second level decoder is coupled to a second side of the first level decoder via a second decoder resistor.

20. The semiconductor device of claim 19, wherein the second decoder resistor is programmable.

\* \* \* \* \*